United States Statutory Invention Registration [19]

[11] Reg. Number: H445

Bock et al.

[43] Published: Mar. 1, 1988

[54] METHOD OF FORMING LIGHT EMITTING DEVICE WITH DIRECT CONTACT LENS

[75] Inventors: Anne B. Bock, Kutztown; Samuel E. Kurtz; Thomas E. Seibert, both of Reading, all of Pa.

[73] Assignee: American Telephone and Telegraph Company, AT&T Technologies, Incorporated, Berkeley Heights, N.J.

[21] Appl. No.: 802,979

[22] Filed: Nov. 29, 1985

[51] Int. Cl.[4] ..... B29D 11/00

[52] U.S. Cl. ..... 264/1.7; 264/129; 264/272.16; 264/272.17; 264/301; 357/70

[58] Field of Search ..... 264/1.5, 1.7, 1.1, 272.16, 264/272.17, 301, 36, 297.8, 129, 297.1; 156/578; 357/70, 72; 425/809

[56] References Cited

U.S. PATENT DOCUMENTS

| | | | |
|---|---|---|---|
| 3,457,131 | 7/1969 | Rosenstein | 156/552 |
| 3,696,263 | 10/1972 | Wacher | 313/499 |
| 3,760,237 | 9/1973 | Jaffee | 317/234 R |
| 3,805,347 | 4/1974 | Collins et al. | 29/25.13 |
| 3,834,966 | 9/1974 | Kelly | 156/299 |
| 3,933,187 | 1/1976 | Marlinski | 156/578 |
| 3,935,501 | 1/1976 | Sterbal | 313/499 |
| 4,013,915 | 3/1977 | Dufft | 313/499 |
| 4,067,937 | 1/1978 | Unno et al. | 264/1.5 |
| 4,100,010 | 7/1978 | Waugh | 264/1.7 |
| 4,107,242 | 8/1978 | Runge | 264/1.5 |
| 4,118,270 | 10/1978 | Parr et al. | 264/1.5 |
| 4,140,451 | 2/1979 | Herdzina, Jr. et al. | 425/809 |
| 4,196,032 | 4/1980 | Eggleston | 264/1.5 |
| 4,209,358 | 6/1980 | DiLeo et al. | 156/293 |
| 4,375,606 | 3/1983 | DiLeo et al. | 357/72 |
| 4,478,588 | 10/1984 | Lockard | 357/72 |
| 4,502,215 | 3/1985 | Davis et al. | 29/874 |

FOREIGN PATENT DOCUMENTS

| | | | |
|---|---|---|---|
| 2651412 | 5/1978 | Fed. Rep. of Germany | 156/578 |

*Primary Examiner*—John F. Terapane
*Assistant Examiner*—Eric Jorgensen
*Attorney, Agent, or Firm*—Wendy W. Koba

[57] ABSTRACT

A method of forming a direct contact lens on a light emitting device structure is disclosed which facilitates the formation of large arrays of light emitting devices. The method uses a printing fixture including a large number of vertically oriented pins which is dipped into a bath of a liquid epoxy material. The printing fixture is then placed over the array structures and lowered until the pins contact the diodes. When the printing fixture is subsequently raised, the lens material will adhere to the associated devices and flow to completely encapsulate the device and a substantial portion of the device mounting structure.

7 Claims, 3 Drawing Figures

'A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

METHOD OF FORMING LIGHT EMITTING DEVICE WITH DIRECT CONTACT LENS

BACKGROUND OF THE INVENTION

1. Field of the Invention

The present invention relates to a method of forming a light emitting device with a direct contact lens structure and, more particularly, to a method of directly depositing a liquid epoxy lens material onto the emitting device. The epoxy will naturally flow to assume a convex shape and completely encapsulate the device and a substantial portion of its associated mounting structure.

2. Description of the Prior Art

Semiconductor light emitting diodes have found ever-increasing use as replacements for filament bulbs in a wide variety of applications. Their small size, low power consumption and long life make them attractive for such uses as indicator lamps in key telephone sets and switchboards. Careful consideration must be given in such uses for distributing the light to produce maximum impact on the viewer. Of the light emitted by a p-n junction, only a small fraction exits through the surface of the diode, due to the "critical angle" of the diode material whereby most of the light becomes reflected and absorbed within the diode material. In this regard, the small size of the diode (approximately 11 mils on each side) is a drawback since light is emitted from too small of an area for good viewing. To overcome this problem, it is necessary to spread the light over a larger area while maintaining a sufficient brightness. This may be accomplished, for example, by placing the LED within a cavity which has formed therein a plurality of spherical lenses as disclosed in U.S. Pat. No. 4,013,915 issued to W. H. Dufft on Mar. 22, 1977. The lens arrangement thus produces an array of discrete images which, when combined, enhance visibility and permit good off-axis viewing. Although this arrangement does indeed improve the attributes of the LED, large scale production of LEDs with the plural spherical structure would be extremely time-consuming and expensive.

An alternative arrangement is disclosed in U.S. Pat. No. 3,805,347 issued to N. E. Collins et al on Apr. 23, 1974. In the Collins et al arrangement, an epoxy material with a convex mensicus surface is placed over the diode element. This epoxy material functions both to increase the critical angle of the diode (and hence the amount of light emitted from the diode) and also to focus this increased amount of light toward the lens, the lens being removed a substantial distance from the surface of the diode. As a variation of this technique, a viscous monomer is placed in the lens cap, prior to the lens cap being fitted onto the diode. When mated, the viscous material will deform by gravity to surround the diode and form a conical light director between the diode and the lens.

Although these and other prior art techniques have been helpful in improving the quality of LEDs, their use in large volume production is limited, since a number of processing steps are required to form this additional material over the diode and to subsequently place the lens cap over the arrangement, where alignment between the lens and the diode is an important consideration. Therefore, a need remains in the prior art for an LED assembly with the required characteristics described above which can be produced in a large-scale manufacture environment.

SUMMARY OF THE INVENTION

The problem remaining in the prior art has been solved in accordance with the present invention which relates to a method of forming a light emitting device with a direct contact lens structure and, more particularly, to a method of directly depositing a liquid epoxy lens material onto the emitting device. The epoxy will naturally flow to assume a convex shape and completely encapsulate the LED and a substantial portion of its associated mounting structure.

It is an aspect of the present invention to provide an LED assembly which is applicable to large-scale manufacture. In accordance with the present invention, large arrays of surface-mounted LEDs may be formed during a single manufacturing cycle. The lenses for these devices are deposited on the array of mounts at the end of the assembly process.

Another aspect of the present invention is the ability to tailor the shape of the mount to individual requirements, since the process of forming the lens on the diode is independent of the shape of the mount. Various shapes including square, round, rectangular, being a few examples.

Yet another aspect of the present invention is to provide a simple and efficient method of modifying the manufacturing process to create LEDs with different color lenses.

Other and further aspects of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
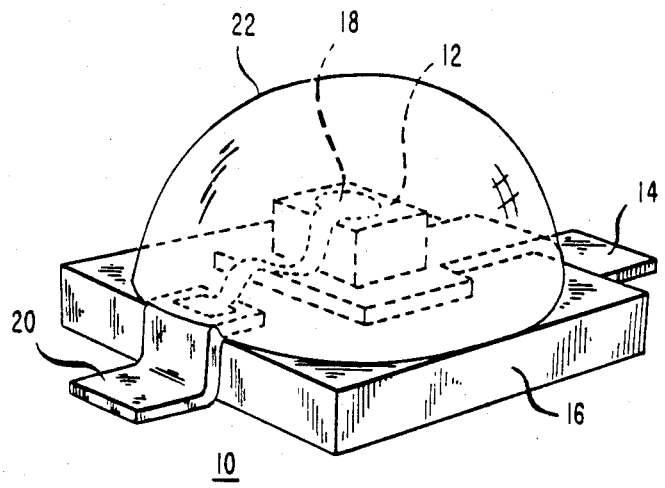
FIG. 1 illustrates an LED assembly with a direct contact lens formed using the method of the present invention.

An exemplary embodiment of an LED assembly 10 formed using the method of the present invention is illustrated in FIG. 1. A light emitting diode 12 is shown and may comprise a gallium phosphide (GaP) chip which emits light in response to an applied bias. The chip usually comprises n-type GaP upon which is grown a layer of p-type GaP which includes dopants of zinc and oxygen to provide recombination centers. However, it is to be understood that any suitable compound may be utilized to form the light emitting device. Further, diode 12, which may also be referred to as the "die" or "chip", is illustrated as a single block for the sake of simplicity. Electrical contact is made to the bottom of diode 12 by a metal contact 14, as shown in FIG. 1. LED assembly 10 includes a base 16, which may be a thermoplastic, or other insulating material. Metal contact 14 is mounted on the top major surface of base 16, where contact 14 may be adhered to base 16 with an epoxy material. The remaining electrical connection to the top of diode 12 is made by a metal contact 18, also referred to as a ribbon contact 18, which is connected to a metal contact 20 attached to base 16 as shown. Positive and negative signals may then be connected to leads 20 and 14 to activate diode 12 and initiate light emission. In accordance with the present invention, a lens 22 is formed over base 16 so as to encapsulate the entire arrangement. This lens structure of the present invention differs significantly from prior art arrangements where the lens is formed in a separate cap piece which is mounted on base 16. In these prior art arrangements, therefore, the lens will be separated from the diode by the internal cavity between the diode and the lens cap. In contrast, the arrangement of the present invention utilizes a lens which is in initimate contact with the diode. Further, as will be discussed in detail hereinafter, the lens is formed by dropping a liquid epoxy material onto the surface of base 16 and allowing the epoxy to flow to conform to the top surface shape of base 16. Any suitable epoxy material may be utilized to form the lens encapsulant, so long as the refractive index of the liquid is greater than unity.

The arrangement illustrated in FIG. 1 comprises a square-shaped base 16. However, base 16 may comprise any desired shape (for example, round or rectangular) where, as stated above, lens encapsulant 22 will naturally flow to conform with the structure. In accordance with its natural viscosity, the lens material will retain convex lens structure necessary to direct the light transmission from diode 12. Once the lens material has sufficiently covered both diode 12 and base 16, assembly 10 is cured to harden the lens material. Compared with prior art arrangements, the lens structure of the present invention will naturally comprise a lower profile, since the lens is in direct contact with the diode. This lower profile provides a significantly increased horizontal viewing angle, denoted a in FIG. 1, where an angle of approximately 75 degrees may be obtained. Additionally, as will be discussed in detail hereinafter, the procedure of forming a large array of LED assemblies utilizing the method of the present invention is greatly simplified over that of the prior art.

Figure 2:
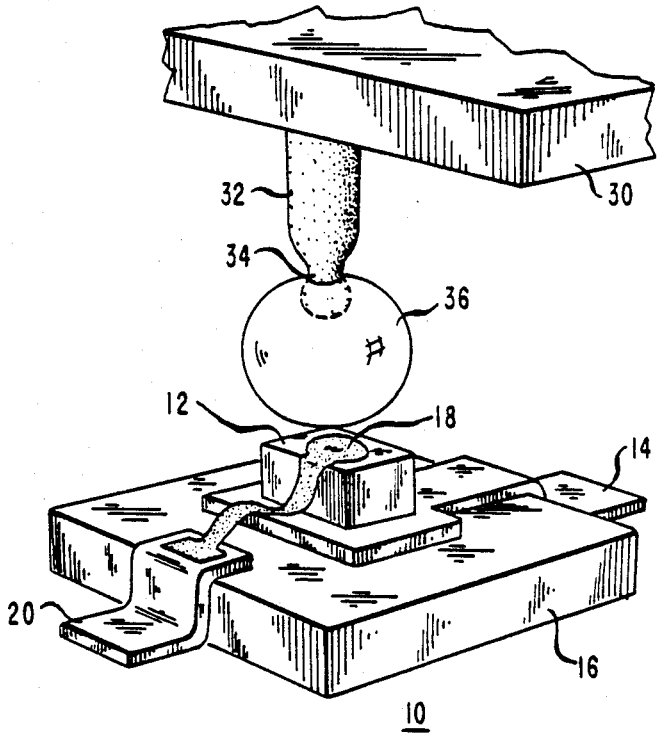
FIG. 2 illustrates an exemplary LED mount without a lens and an associated structure used in the method of the present invention to deposit the lens material on the mount.

In fact, utilizing the method of the present invention allows for arrays of LEDs to be formed during a single manufacturing cycle. To form these LED arrays, a unique method of forming the lens encapsulate on the diode base has been developed. In particular, a deposition apparatus 30, as shown in FIG. 2, is utilized which includes a vertical pin 32 extending downward from the bottom major surface of deposition apparatus 30. As shown in FIG. 2, pin 32 may comprise a tapered section 34 at its tip. After the electrical contacts have been made to diode 12, where the attachment of ribbon 18 is usually the last step in this process, deposition apparatus 30 is dipped into a bath of epoxy material (not shown) and subsequently removed so that a small amount of the epoxy will adhere to the tip of pin 32, shown as epoxy droplet 36 in FIG. 2. It is to be understood that any liquid epoxy material with an index of refraction greater than 1 may be used in forming the bath required to practice the present invention. In fact, different color LEDs may easily be formed in accordance with the present invention simply by having a number of different baths (for example, red, yellow, and green) all available for use. Using the method of the present invention, deposition apparatus 30 is placed over base 16 and lowered in the direction shown by the arrows in FIG. 2 such that the tip of pin 32 comes in contact with ribbon 18. As soon as contact is made, deposition apparatus 30 is raised, and the droplet of epoxy 36 will adhere to the diode assembly. Droplet 36 will then flow to completely encapsulate diode 12 as well as contact 14 and 18. A substantial amount of the epoxy will also cover contact 20 and the top major surface of base 16, as can be seen by reference to the completed structure in FIG. 1. To complete the manufacturing process, assembly 10 is cured to harden the lens material, where lens 22 will naturally assume the required convex lens structure.

Figure 3:
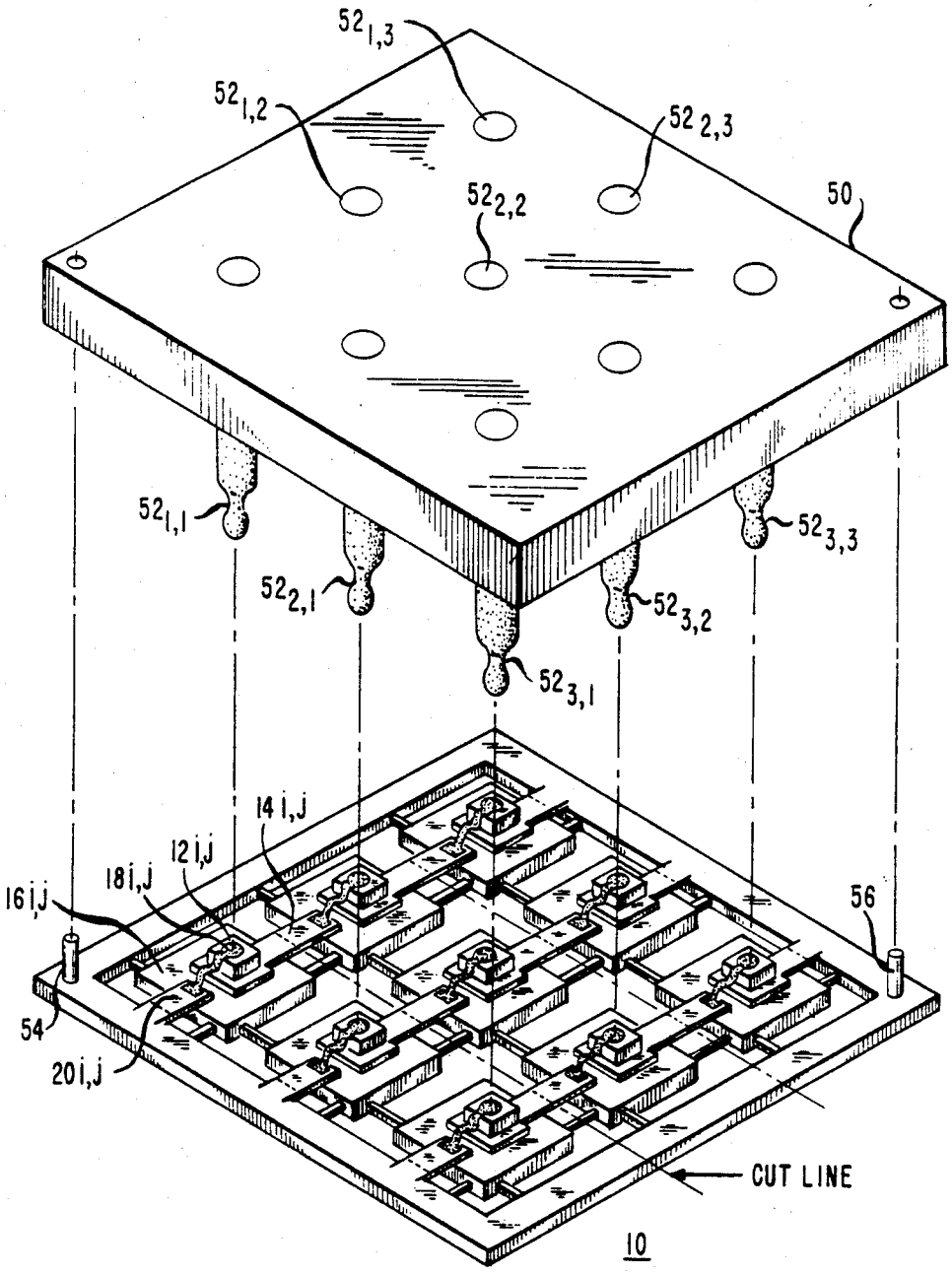
FIG. 3 illustrates an array of LED mounts and a deposition apparatus capable of simultaneously forming an array of lenses in accordance with the method of present invention.

Utilizing this technique of forming the lens on the diode assembly, it is fairly simple to form a large array of diodes in a single manufacturing step. One such arrangement is illustrated in FIG. 3, which shows for the sake of simplicity a $3\times3$ diode array 10. In the actual practice of the present invention, arrays of the size $100\times100$ can easily be formed. Each individual diode assembly illustrated in FIG. 6 is identical to that of FIG. 1, where subscripts have been added to the numerals simply to define the placement of the individual diodes in the rows and columns of the array. The lens material may be deposited on this array assembly using a deposition apparatus 50 as shown, which includes an array of vertical pins $52_{1,1}$ through $52_{3,3}$, disposed as shown such that each pin is associated with a separate diode element. As with the above-described single lens manufacture procedure, deposition apparatus 50 may be dipped into an epoxy bath and then transferred to the array structure. The two-step motion of lowering and then raising structure 50 will thus form an array of lens encapsulants over diode assembly 40. For this particular arrangement, alignment between the diode array and the deposition apparatus may be assured by performing all of the manufacturing steps in the same mounting fixture, where a set of mounting pins 54 and 56, as shown in FIG. 3, will ensure adequate alignment.

What is claimed is:

1. A method of forming a direct contact lens on a semiconductor light emitting device assembly comprising the steps of:

a. lowering a deposition apparatus including a downwardly extending vertical pin into a path of a liquid lens material;

b. removing said deposition apparatus from said bath so that a drop of lens material adheres to said vertical pin;

c. lowering said deposition apparatus over said semiconductor light emitting device so that said drop of lens material contacts a top portion of said semiconductor light emitting device;

d. raising said deposition apparatus in a manner such that said drop of lens material adheres to said device and flows to substantially cover both said device and a mounting structure holding said device to form the direct contact lens for said semiconductor light emitting device; and e. curing said light emitting device assembly to harden the direct contact lens in its final form.

2. The method of claim 1 in which the vertical pin comprises a tapered tip section so as to allow a sufficient amount of lens material to adhere to said vertical pin to provide substantial coverage of both the semiconductor light emitting device and the mounting structure.

3. The method of claim 1 wherein the bath of liquid lens material comprises a liquid epoxy material with a refractive index greater than 1.

4. A method of forming a plurality of lenses on an associated plurality of semiconductor light emitting devices included in a device assembly, the method comprising the steps of:

a. lowering a deposition assembly including a plurality of downwardly extending vertical pins into a bath of liquid lens material;

b. removing said deposition assembly from said bath so that a drop of lens material adheres to each pin of said plurality of downwardly extending vertical pins;

c. lowering said printing structure over said plurality of semiconductor light emitting devices so that each drop of lens material contacts a separate one of said plurality of semiconductor light emitting devices;

d. raising said deposition assembly in a manner such that each drop of lens material adheres to its associated semiconductor light emitting device and flows to substantially encapsulate the semiconductor light emitting device and a portion of an associated mounting structure; and e. curing said light emitting device assembly to harden said plurality of lenses in their final form.

5. The method of claim 4 wherein the plurality of light emitting devices is arranged in an array configuration.

6. The method of claim 4 wherein each pin of the plurality of downward extending vertical pins comprises a tapered tip section.

7. The method of claim 4 wherein the liquid lens material comprises a liquid epoxy material with a refractive index greater than 1.

* * * * *